(12) United States Patent
Xiang et al.

(10) Patent No.: US 8,339,199 B2
(45) Date of Patent: Dec. 25, 2012

(54) PRE-AMPLIFIER

(75) Inventors: Jianjun Xiang, Chengdu (CN); Zhaoqiang Yue, Chengdu (CN)

(73) Assignee: IPGoal Microelectronics (SiChuan) Co., Ltd., Chengdu, Sichuan Province (CN)

( * ) Notice: Subject to any disclaimer, the term of this patent is extended or adjusted under 35 U.S.C. 154(b) by 116 days.

(21) Appl. No.: 12/952,022

(22) Filed: Nov. 22, 2010

(65) Prior Publication Data
US 2011/0285468 A1 Nov. 24, 2011

(30) Foreign Application Priority Data
Dec. 10, 2009 (CN) .......................... 2009 1 0216680

(51) Int. Cl.
*H03F 3/45* (2006.01)
(52) U.S. Cl. ...................................................... 330/253
(58) Field of Classification Search ........... 330/252–261
See application file for complete search history.

(56) References Cited

U.S. PATENT DOCUMENTS

| | | | |
|---|---|---|---|
| 7,576,609 B1 * | 8/2009 | Huang et al. .................. | 330/258 |
| 7,719,361 B2 * | 5/2010 | Pera .............................. | 330/260 |

\* cited by examiner

*Primary Examiner* — Hieu Nguyen

(57) ABSTRACT

A pre-amplifier comprises at least two PMOS transistors operated as source followers and two NMOS transistors operated as amplifiers, or, two NMOS transistors operated as source followers and two PMOS transistors operated as amplifiers to raise or reduce the voltage of input signals and at least four current sources with the same current value which can be adjusted according to the output load of the pre-amplifier. The MOS transistors have the same transconductance so that the minimum differential voltage can be attained. Since the differential signals change alternately, MOS transistors will switch among the three working status: cut-off, saturation and linear region. Because of the cut-off and linear region, the present invention can achieve the very low power consumption less than one third of the conventional one.

8 Claims, 4 Drawing Sheets

PRE-AMPLIFIER

BACKGROUND OF THE PRESENT INVENTION

1. Field of the Invention

The present invention relates to a pre-amplifier in the field of high speed and low impedance transmission, more particularly, when low impedance transmission line is used as the transmission medium.

2. Brief Description of Related Arts

Currently, in the field of high speed and low impedance transmission, it is a conventional way to use a high speed operational amplifier as a pre-amplifier, to obtain a large bandwidth by way of higher power consumption, and accordingly, amplify the reception signals of high speed data.

Usually, existing products in current markets use a high speed amplifier for pre-amplification to strengthen reception. The high bandwidth of the operational amplifier is used to enlarge high speed input signals. However, the high speed amplifier requires higher bandwidth, which, in turn, means greater demand for power consumption.

FIG. 1 illustrates one of pre-amplifiers described above. P1, P2 represents respectively the differential pair input transistors PMOS; N1, N2, N3, N4 are load transistors NMOS with the same size; P3, P4 are load transistors PMOS with the same size; CL is the equivalent load capacitor of the output, wherein vcm is the offset voltage of Common-Mode-Feedback (CMF).

When pre-amplifying, this type of operational amplifier with the structure described above works within a saturation region. The gain with this structure is approximately as follows:

$$Ad = (g_{mp1}/g_{mn1})g_{mn3}(R_{on3}||R_{op3}||1/sC_L)$$
$$\approx g_{mp1}(R_{on3}||R_{op3}||1/sC_L)$$
$$= g_{mp1}[R_{on3}R_{op3}/(R_{on3}+R_{op3}+sC_LR_{on3}R_{op3})];$$

Its 3 dB bandwith is approximately $s3\ dB \approx$ $$(R_{on2}+R_{op3})/(C_LR_{on3}R_{op3}) = 1/[R_{on3}||R_{op3})CL] = 1/(RoC_L),$$

wherein $Ro = R_{on3}||R_{op3}$

It can be indicated from the above equation that when the load capacitor is fixed, the wider the 3 dB bandwidth requires, the smaller the Ro is. However, since Ro is proportional to $1/\lambda I$, wherein $\lambda$ is a fixed parameter depending on the size of MOS transistor, the magnitude of the 3 dB bandwidth depends on the current I. The wider the 3 dB bandwidth is, the bigger the required current is.

SUMMARY OF THE PRESENT INVENTION

The objective of the present invention is to furnish a pre-amplifier that is the equivalent of a current switch with a clamping voltage, whereby high speed signals can be enlarged with less power consumption and the required current, when the input and amplifier gain are the same, accounts for only less than one third of conventional preamplifier's.

In accordance to the present invention, the preamplifier comprises:

at least two PMOS transistors as source followers and two NMOS transistors as amplifiers, or at least two NMOS transistors as source followers and two PMOS transistors as amplifiers for increasing or decreasing voltage; and at least four tail current sources with the same current value, wherein the current value can be adjusted according to the load of the two output terminals of the amplifier.

It is known from current formula of MOS transistor, $I=\frac{1}{2}UC_{OX}W/L(V_{GS}-V_{TH})^2$, that when same currents flow through the four MOS transistors which are in a saturation status, if the transconductances of the MOS transistors are designed with the same value, the minimum differential voltage that the preamplifier is able to receive should be $|V_{THP}-V_{THN}|/2$, wherein U represents carrier mobility; Up represents the carrier hole mobility in the channel of PMOS transistors; Un represents the carrier hole mobility in the channel of NMOS transistors;

Cox represents the gate oxide capacitance per unit area;

W represents the channel width of a PMOS or a NMOS transistor;

L represents the channel length of a PMOS or a NMOS transistor;

$V_{GS}$ represents the static voltage difference between the gate and the source of a PMOS or a NMOS transistor;

$V_{TH}$ represents the corresponding threshold voltage of a PMOS or a NMOS transistor.

When two PMOS transistors are used as source followers to make input signals follow the source so as to increase the voltage of input signals, two NMOS transistors are used as current switches to turn on and control the gate-source voltage of the two NMOS transistors.

Two diodes can be used to attain the minimum clamping voltage.

A receiver can be used to process the preamplified signals. Its input can be modeled as the two equal load capacitors of the preamplifier.

The NMOS transistors operate as current switches and, when with stable signals being inputted in, work alternately in cut-off region or linear region. During the cut-off range all tail currents flow into load capacitors, while during the linear range stronger currents flown out. Based on the above switching current characteristics, the present preamplifier has the advantage of low power consumption and high bandwidth.

The four tail currents have the same current value, which can be adjusted according to the load capacitors connected with.

The absolute saturation current value of NMOS transistor is: $Ib=\frac{1}{2}u_nC_{OX}W/L(V_{GSN}-V_{THN})^2$; the absolute saturation current value of PMOS transistor is: $Ib=\frac{1}{2}u_pC_{OX}W/L(V_{GSP}-V_{THP})^2$;

Because differential signals change alternately, when input signals are bigger, NMOS transistors used for amplifying signals will switch among the three states of cut-off, saturation and linear region, whereas the conventional amplifiers could only work in their saturation region. Just because of the cut-off and linear working region, the power consumption of the preamplifier can be reduced to less than one third of the conventional ones.

When two NMOS transistors are used as source followers to implement source following to lower the voltage of the input signals, two PMOS transistors are used as current switches to turn on and control the gate-source voltage.

The two PMOS transistor, when with stable signals being inputted in, work alternately in cut-off region and linear region. During the cut-off range all tail currents are drawn out rapidly from load capacitors, while during the linear range much more electric charges flow into load capacitors. Therefore, the present preamplifier, with the switching current characteristics, has the advantage of low power consumption and high bandwidth.

Likewise, when input signals are bigger, PMOS transistors used for amplifying signals will switch among the three states of cut-off, saturation and linear region, while the conventional amplifiers could only work in their saturation region. Just because of the cut-off and linear working region, the power consumption of the preamplifier can be reduced to less than one third of the conventional.

These and other objectives, features, and advantages of the present invention will become apparent from the following detailed description, the accompanying drawings, and the appended claims.

DETAILED DESCRIPTION OF PREFERRED EMBODIMENTS

Figure 1:
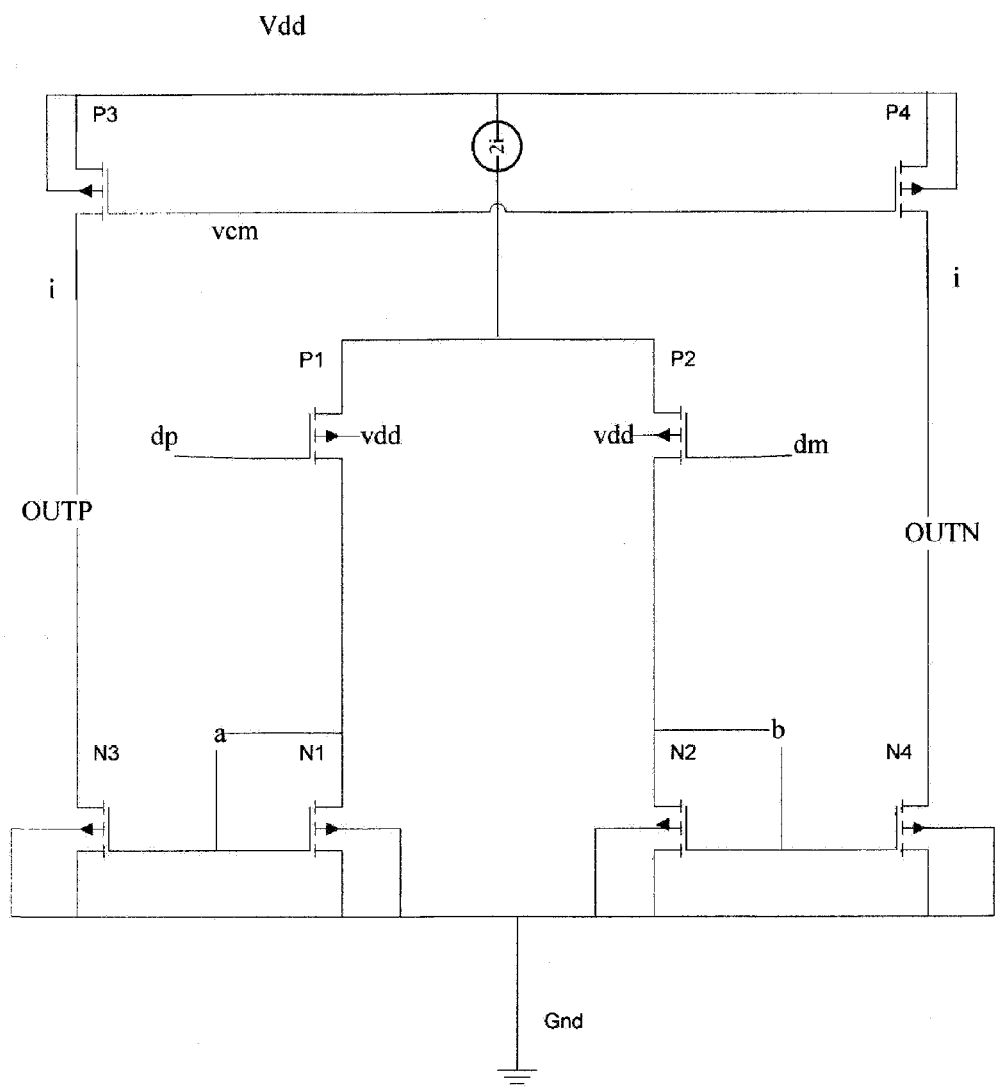
FIG. 1 is a structural diagram of a conventional preamplifier.
Figure 2:
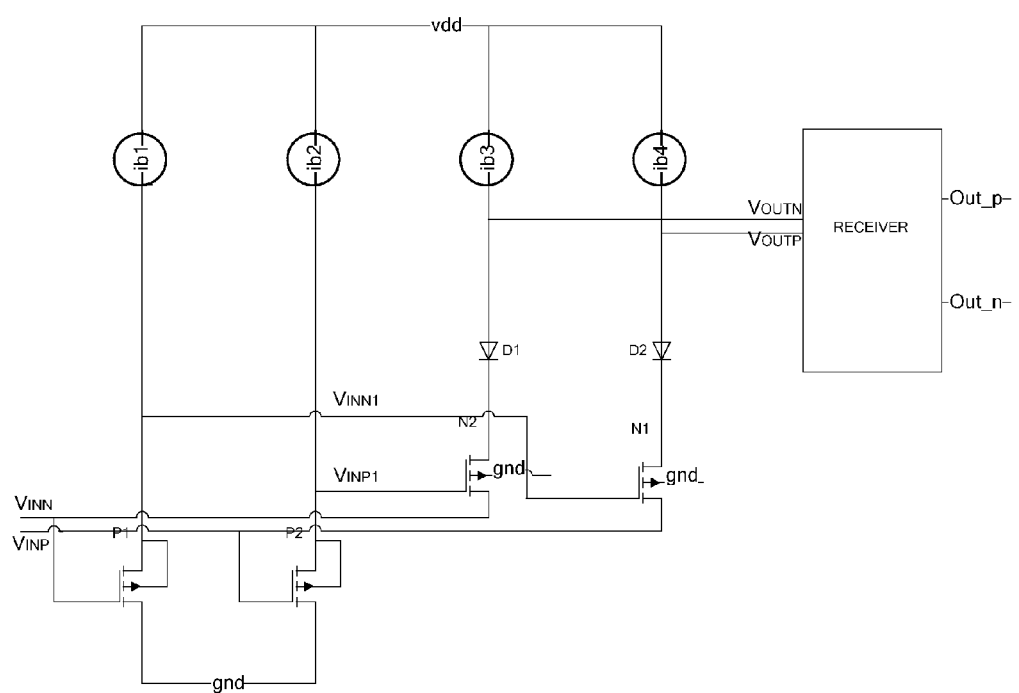
FIG. 2 is the structural diagram of the present invention when using PMOS transistors as the source followers.

Referring to FIG. 2, when two PMOS transistors P1, P2 are used as source followers to make signals $V_{INP}$ and $V_{INN}$ follow the source so as to increase the voltage of input signals $V_{INP}$, $V_{INN}$, two NMOS transistors are be used as current switches to turn on and control the gate-source voltage $V_{GSN1}$, $V_{GSN2}$, which are as follow:

$$V_{GSN1}=V_{INN1}-V_{INP}=(V_{GSP1}+V_{INN})-V_{INP}$$

$$V_{GSN2}=V_{INP1}-V_{INN}=(V_{GSP2}+V_{INP})-V_{INN}$$

Two diodes D1 and D2 are used to attain the minimum clamping voltage. The minimum voltage is as follow:

$$V_{OUTN\_mim}=V_{INN}+V_{DSN2}+V_{D1}$$

$$V_{OUTP\_mim}=V_{INP}+V_{DSN1}+V_{D2}$$

Wherein $V_{OUTP\_mim}$, $V_{OUTN\_mim}$ represents the minimum voltage of positive and negative output terminals of the amplifier, respectively; $V_{D1}$, $V_{D2}$ represents respectively the voltage difference between two terminals of D1 or D2 with rated currents passing through them.

A receiver is used to process the preamplified signals. Its input is the equivalent of two equal load capacitors of the preamplifier.

The specific circuit is illustrated in FIG. 2. The drains of P1 and P2 are grounded;

the gate of P1 is connected with the input signals $V_{INN}$ and the gate of P2 is connected with the input signal $V_{INP}$;

the source of P1 is connected with its own substrate and also connected with the gate of N1 and current source ib1;

the source of P2 is connected with its own substrate and also connected with the gate of N2 and current source ib2;

the gate of N1 is connected with the source of P1, the source of N1 is connected with the input signal $V_{INP}$, the substrate of N1 is grounded and the drain of N1 is connected with the negative electrode of diode D2;

the gate of N2 is connected with the source of P2, the source of N2 is connected with the input signal $V_{INN}$, the substrate of N2 is grounded and the drain of N2 is connected with the negative electrode of diode D1;

the negative electrode of D1 is connected with the drain of N2; the positive electrode of D1 is connected with the current source ib3 and also connected to the input terminal of the receiver Voutn;

the negative electrode of D2 is connected with the drain of N1; the positive electrode of D2 is connected with the current source ib4 and also connected to the other input terminal of the receiver Voutp;

the positive output terminal of the receiver is Out_p; the negative output terminal of the receiver is Out_n.

When rated currents are flowing through, the gate-source voltages of NMOS transistors N1 and N2, as amplifiers, they have the following switching characteristics:

When $V_{GSN1}>V_{GSN1T}$, the current switch N1 turns on; when $V_{GSN1}<V_{GSN1T}$, N1 turns off; all tail currents can flow into or greater currents can flow out from load capacitors. When $V_{GSN2}>V_{GSN2T}$, the current switch N2 turns on; when $V_{GSN2}<V_{GSN2T}$, it turns off, so that all tail currents can flow into or much more currents can flow out from load capacitors.

The two NMOS transistors N1 and N2, when having stable signals being inputted in, work alternately in cut-off region or linear region. During the cut-off range all tail currents flow into load capacitors, while during the linear range stronger currents flow out.

The four paths of tail currents have the same current value, which can be adjusted according to the load capacitors $V_{OUTP}$ and $V_{OUTN}$ connect with.

The absolute saturation current value of NMOS transistor is:
$Ib=\frac{1}{2}u_nC_{OX}W/L(V_{GSN}-V_{THN})^2$ The absolute saturation current value of PMOS transistor is:
$Ib=\frac{1}{2}u_pC_{OX}W/L(V_{GSP}-V_{THP})^2$;

Make the transconductance of NMOS and PMOS, $g_{mn}$ and $g_{mp}$, the same value and both work in the saturation region, namely, $g_{mp}=[2u_pC_{ox}(Wp/Lp)I_b]^{1/2}$ $g_{mn}=[2u_nC_{ox}(Wn/Ln)I_b]^{1/2}$, wherein $g_{mn}=g_{mp}$, then the following equation can also be attained:

$$2u_pC_{ox}(Wp/Lp)=2u_nC_{ox}(Wn/Ln), |V_{GSN}-V_{THN}|=|V_{GSP}-V_{THP}|=|V_{INN}-V_{INN1}-N_{THP}|;$$

The further can be attained: $V_{GSN}-V_{THN}=V_{INN1}+V_{THP}-V_{INN}>0$, $V_{GSN}=V_{INN1}+V_{THP}-V_{INN}+V_{THN}>0$;

To implement turning on or turning off, current switch N1 needs to work in its linear region, and the corresponding equation is: $|V_{INN1}-V_{INP}|>V_{GSN}=V_{INN1}-V_{INN}+V_{THP}+V_{THN}$ When $V_{INN1}-V_{INP}>0$ and $V_{INP}-V_{INN}<-(V_{THN}+V_{THP})$, then N1 is able to turn on; if $V_{INN1}-V_{INP}<0$, N1 is not able.

To implement turning on or turning off, current switch N2 needs to work in its linear region, and the corresponding equation is: $|V_{INP1}-V_{INN}|>V_{GSN}=V_{INP1}-V_{INP}+V_{THP}+V_{THN}$ When $V_{INP1}-V_{INN}>0$, $V_{INP}-V_{INN}>V_{THN}+V_{INP}$, N2 is able to turn on; contrarily, if $V_{INP1}-V_{INN}<0$, N2 is not able to, namely, only if $|V_{INN}-V_{INP}|>|V_{THN}+V_{THP}|$, the current switch is able to work normally.

It is obvious that PMOS transistor and NMOS transistor in the saturation status have the current with the same value flowing through; accordingly, the only thing needs to be done is make the PMOS transistor and NMOS transistor have the same transconductance, thereby the minimum differential voltage that the preamplifier is able to receive is $|V_{THP}-V_{THN}|$.

Figure 4:
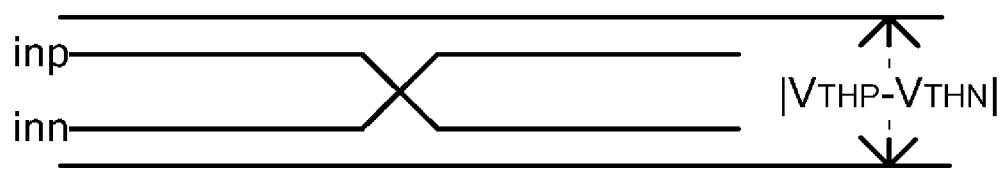
FIG. 4 is a waveform when the differential voltage of the present invention is less than the minimum one.

Referring to FIG. 4, when a differential voltage is lower than the minimum one, the gate-source voltage VGSN is less (when $V_{THN}>-V_{THP}$), then the current switch NMOS transistor is in a weak conducting state and rated tail currents Ib is not able to flow through it; therefore parts of currents in current switches N1 and N2 which can not flow through are going to charge the load capacitors in order to make the output voltage of the two load capacitors be in a high level. When $-V_{THP}>V_{THN}$, the gate-source voltage VGSN is bigger, the current switch is in a strong conducting state, and currents bigger than the rated tail current are able to flow through, therefore the current switch NMOS that is lacking of tail currents will cause the load capacitors to discharge in order to make the output voltage of the two load capacitors be in a low level.

Figure 5:
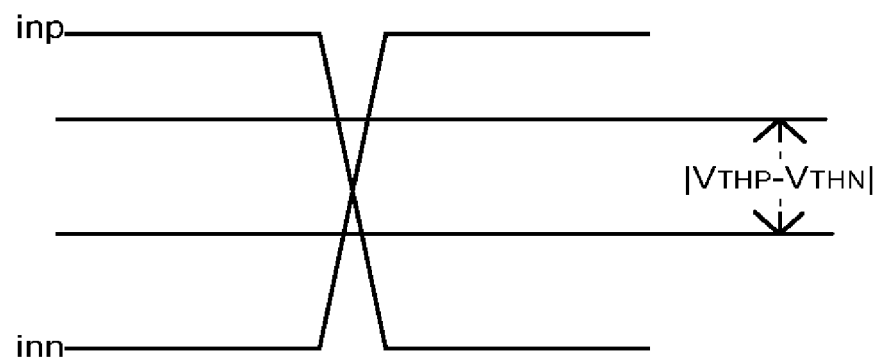
FIG. 5 is a waveform when the differential voltage of the present invention is bigger or much bigger than the minimum one.

As shown in FIG. 5, when the differential voltage is bigger or even much bigger than the minimum one, one current switch will be in its off state, which causes currents go to the load capacitors and makes the voltage of the load capacitors go up rapidly, whereas the other current switch will be in its linear region with a strong conducting state, which, after having drawn out all tail currents, is still able to discharge rapidly the load capacitors in order to lower the output level.

Since the input signals are crossing symmetrical, when the differential voltage of the two signals is less than $|V_{THP}-V_{THN}|$, the value of $V_{TH}$ depends completely on the source follower PMOS transistor and current switch NMOS transistor. When the voltage $V_{TH}$ of the source follower PMOS is higher than that of the current switch NMOS, the two current switches NMOS transistors will work in their linear region, therefore the differential input signals can not be enlarged effectively and at the same time the outputted common-mode-voltage tends to be lower. Accordingly, only if when the maximum differential voltage of the two input signals is bigger than $|V_{THP}-V_{THN}|$, the two signals can be received effectively.

Because differential signals change alternately, consequently, when input signals are bigger, NMOS transistors used for amplifying signals will switch among the three states of cut-off, saturation and linear region, while the conventional amplifiers could only work in their saturation region. Just because of the cut-off and linear working region, the power consumption of the preamplifier can be reduced to less than one third of the conventional one's.

Figure 3:
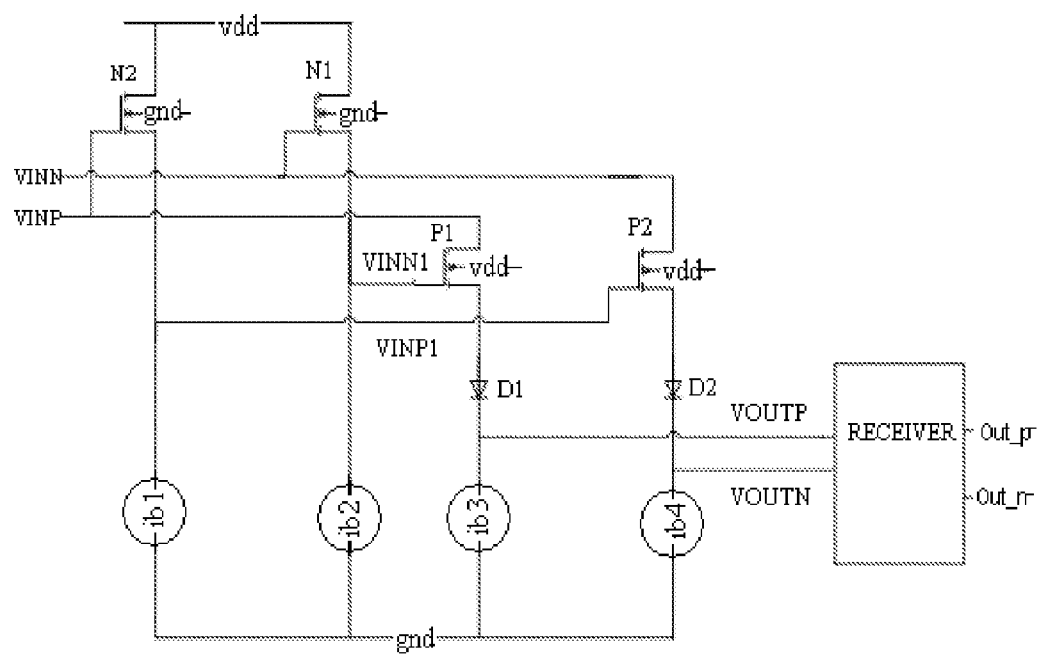
FIG. 3 is the structural diagram of the present invention when using MNOS transistors as the source followers.

As shown in FIG. 3, when two NMOS transistors N1 and N2 are used as source followers to implement source following of and lower the voltage of the input signals $V_{INP}$, $V_{INN}$, two PMOS transistors P1 and P2 are used as current switches to turn on and control the gate-source voltage of $V_{GSP1}$, $V_{GSP2}$. Here, $V_{GSP1}=V_{INN1}-V_{INP}=V_{INN}-V_{GSN1}-V_{INP}$, $V_{GSP2}=V_{INP1}-V_{INN}=V_{INP}-V_{GSN2}-V_{INN}$.

Two diodes D1 and D2 are used to attain the maximum clamping voltage. The maximum voltage is as follow:

$$V_{OUTN\_max}=V_{INN}-V_{DSN2}-V_{D2}$$

$$V_{OUTP\_max}=V_{INP}-V_{DSN1}-V_{D1},$$

wherein, $V_{OUTP\_max}$ and $V_{OUTN\_max}$ are maximum voltages which the positive and negative output terminal of the preamplifier outputs respectively; $V_{D1}$, $V_{D2}$ are the voltage difference between two terminals of diodes when currents are flowing through it.

A receiver is used to process the preamplified signals. Its input terminals are equivalents of two equal load capacitors of the preamplifier.

The specific circuit is illustrated in FIG. 3. The drains of N1 and N2 connect to power vdd;

the gate of N1 is connected with the input signals $V_{INN}$ and the gate of N2 is connected with the input signal $V_{INP}$;

the source of N1 is connected with the gate of P1 and also connected with current source ib2;

the source of N2 is connected with the gate of P2 and also connected with current source ib1;

the gate of P1 is connected with the source of N1, the source of P1 is connected with the input signal $V_{INP}$, the substrate of P1 is connected to the power and the drain of P1 is connected with the positive electrode of D1;

the gate of P2 is connected with the source of N2, the source of P2 is connected with the input signals $V_{INN}$, the substrate of P2 is connected to the ground and the drain of P2 is connected with the positive electrode of D2;

the positive electrode of D1 is connected with the drain of P1 while the negative electrode of D1 is connected with current switch ib3 and the input Voutp of RECEIVER;

the positive electrode of D2 is connected with the drain of P2 while the negative electrode of D1 is connected with current switch ib4 and the input Voutn of RECEIVER;

wherein Out_p is the positive output terminal of RECEIVER and Out_n is the negative one.

When rated currents are flowing through, the gate-source voltages of NMOS transistors P1 and P2, used as amplifiers, are $V_{GSP1T}$ and $V_{GSP2T}$, with the following switching characteristics:

When $|V_{GSP1}|>|V_{GSP1T}|$, the current switch P1 turns on; when $|V_{GSP1}|<|V_{GSP1T}|$, P1 turns off; therefore, much greater electric charges can go to load capacitors or be drawn out from load capacitors due to the rated tail current.

When $|V_{GSP2}|>|V_{GSP2T}|$, the current switch P2 turns on; when $|V_{GSP2}|<|V_{GSP2T}|$, P2 turns off; therefore, much more electric charges can go to load capacitors or drawn out from load capacitors by virtue of the rated tail current.

The two PMOS transistors P1 and P2, when stable signals are being inputted, work alternately in cut-off region and linear region. During the cut-off range all tail currents are drawn out rapidly from load capacitors, while during the linear range much more electric charges flow into load capacitors.

The four paths of tail currents have the same current value which can be adjusted according to the load capacitors $V_{OUTP}$ and $V_{OUTN}$ connect with.

The absolute saturation current value of NMOS transistor is: $Ib=\frac{1}{2}u_nC_{OX}W/L(V_{GSN}-V_{THN})^2$ The absolute saturation current value of PMOS transistor is: $Ib=\frac{1}{2}u_pC_{OX}W/L(V_{GSP}-V_{THP})^2$;

Make the transconductance of NMOS and PMOS, $g_{mn}$ and $g_{mp}$, the same value and both work in the saturation region, which means:

$g_{mp}=[2u_pC_{ox}(Wp/Lp)I_b]^{1/2}$    $g_{mn}=[2u_nC_{ox}(Wn/Ln)I_b]^{1/2}$ $g_{mn}=g_{mp}$, then the following equations can be attained:

$2u_pC_{ox}(Wp/Lp)=2u_nC_{ox}(Wn/Ln)$, $|V_{GSP}-V_{THP}|=|V_{GSN}-V_{THN}|=|V_{INN}-V_{INN1}-V_{THN}|$

The further equations can be attained: $V_{GSP}-V_{THP}=V_{INN1}+V_{THN}-V_{INN}<0$    $V_{GSP}=V_{INN1}+V_{THP}-V_{INN}+V_{THN}<0$;

To implement turning on and turning off, current switch P1 needs to work in its linear region, accordingly the equation is $|V_{INN1}-V_{INP}|>|V_{GSP}|=|V_{INN1}-V_{INN}+V_{THP}+V_{THN}|$.

When $V_{INN1}-V_{INP}>0$, P1 is not able to turn on, whereas when $V_{INN1}-V_{INP}<0$ and $V_{INP}-V_{INN}>V_{THN}+V_{THP}$, P1 is able.

To implement turning on and turning off, current switch P2 needs to work in its linear region, accordingly the equation is $|V_{INP1}-V_{INN}|>|V_{GSP}|=|V_{INP1}-V_{INP}+V_{THP}+V_{THN}|$.

When $V_{INP1}-V_{INN}>0$, P2 is not able to turn on, whereas when $V_{INP1}-V_{INN}<0$ and $V_{INP}-V_{INN}<-(V_{THN}+V_{THP})$, P2 is able; namely, only if $|V_{INN}-V_{INP}|>|V_{THN}+V_{THP}|$, the current switch is able to work normally.

It can be seen that PMOS transistor and NMOS transistor in the saturation status have the current with the same value flowing through; accordingly, the only thing needs to be done is just make the PMOS transistor and NMOS transistor have the same transconductance, thereby the minimum differential voltage that the preamplifier is able to receive is $|V_{THP}-V_{THN}|$.

As shown in FIG. 4, when a differential voltage is lower than the minimum one, the gate-source voltage $V_{GSP}$ of current switch PMOS is less (when $V_{THN}<-V_{THP}$), so the current switch PMOS transistor is in a weak conducting state and is not able to provide rated tail currents Ib. One part of tail currents will come from the conducting currents of P1 and P2 transistors while another part will come from the discharging load capacitors, so that both outputs will be in a low level.

When $-V_{THP}<V_{THN}$, once the gate-source voltage $V_{GSP}$ is bigger, the current switch is in a a strong conducting state, which means currents bigger than the rated tail current Ib are able to flow through; therefore the current switches P1 and P2 have bigger flow of electric currents than the tail currents Ib, and then P1 and P2 will inject electric charges to load capacitors in order to make the output voltages of the two load capacitors be in high level.

As shown in FIG. 5, when the differential voltage is bigger or even much bigger than the minimum, one current switch will be in its off state, which causes currents go out of the load capacitors and makes the voltage on the load capacitors go down rapidly, while the other current switch will be in its linear region with a strong conducting state, which, besides providing tail currents, will inject bigger electric charges to the load capacitors in order to raise the output level.

Since the two input signals are crossing symmetrical, when the differential voltage of the two signals is smaller than $|V_{THP}-V_{THN}|$, the value of $V_{TH}$ depends completely on source followers N1 or N2 and current switches P1 or P2. When the voltage $V_{TH}$ of the source followers N1 or N2 is higher than that of the current switch P1 or P2, both the two current switches NMOS transistors work in their linear region, therefore the differential input signals can not be enlarged effectively and at the same time the outputted common-mode-voltage tends to be higher. Contrarily, when the voltage $V_{TH}$ of the source followers N1 or N2 is smaller than that of the current switch P1 or P2, the two current switches NMOS tend to be cut off, therefore can not enlarge the differential signals effectively and at the same time cause the common-mode-voltage going down.

Accordingly, only if the maximum differential voltage of the two input signals is bigger than $|V_{THP}-V_{THN}|$, the two signals can be received effectively.

Because differential signals change alternately, when input signals are bigger, P1 or P2 used for amplifying signals will switch among the three states of cut-off, saturation and linear region, while the conventional amplifiers could only work in their saturation region. Just because of the cut-off and linear working region, the power consumption of the preamplifier can be reduced to less than one third of the conventional.

One skilled in the art will understand that the embodiments of the present invention as shown in the drawings and described above is exemplary only and not intended to be limiting.

It will thus be seen that the objects of the present invention have been fully and effectively accomplished. Its embodiments have been shown and described for the purpose of illustrating the functional and structural principles of the present invention and is subject to change without departure from such principles. Therefore, this invention includes all modifications encompassed within the spirit and scope of the following claims.

What is claimed is:

1. A pre-amplifier, comprising:
   at least two PMOS transistors as source followers and two NMOS transistors as amplifiers, or at least two NMOS transistors as source followers and two PMOS transistors as amplifiers for increasing or decreasing voltage;
   at least four tail current sources with same current value, wherein a charging and discharging current of a load capacitor of two output terminals Out_p and Out_n are adjusted according to a differential voltage of two input terminals $V_{INN}$ and $V_{INP}$;
   two diodes; and
   a receiver, wherein if two PMOS transistors are used as source followers to make input signals follow the source so as to increase the voltage of input signals and two NMOS transistors are used as current switches to turn on and control the gate-source voltage of the two NMOS transistors, wherein the two diodes are used to attain the minimum clamping voltage and the receiver is used to process the preamplified signals with its input as the equivalent of two equal load capacitors of the preamplifier.

2. The pre-amplifier set forth in claim 1, wherein if P1, P2, N1, N2, D1, D2, RECEIVER are used to represent two PMOS transistors, two NMOS transistors, two diodes and a receiver respectively; ib1, ib2, ib3 and ib4 represent four current sources; $V_{INN}$ and $V_{INP}$ represents two input signals; Voutp and Voutn represent two input terminals of the receiver, their connections are as follows:
   the drains of P1 and P2 are grounded;
   the gate of P1 is connected with $V_{INN}$ and the gate of P2 is connected with $V_{INP}$;
   the source of P1 is connected with its own substrate and also connected with the gate of N1 and ib1;
   the source of P2 is connected with its own substrate and also connected with the gate of N2 and ib2;
   the source of N1 is connected with $V_{INP}$, the substrate of N1 is grounded and the drain of N1 is connected with the negative electrode of D2;
   the source of N2 is connected with $V_{INN}$, the substrate of N2 is grounded and the drain of N2 is connected with the negative electrode of D1;
   the negative electrode of D1 is connected with the drain of N2; the positive electrode of D1 is connected with ib3 and also connected to Voutn;
   the negative electrode of D2 is connected with the drain of N1; the positive electrode of D2 is connected with ib4 and also connected to Voutp.

3. The pre-amplifier set forth in claim 1, wherein if N1 and N2 are used to represent two NMOS transistors, and $V_{GSN1T}$, $V_{GSN2T}$ are used to represent their corresponding gate-source voltage when rated currents are flowing through, the switching characteristics of the NMOS transistors, operating as amplifiers, are as follows:
   when $V_{GSN1}>V_{GSN1T}$, current switch N1 turns on; when $V_{GSN1}<V_{GSN1T}$, N1 turns off, so that all tail currents can flow into or greater currents can flow out from load capacitors of the pre-amplifier;
   when $V_{GSN2}>V_{GSN2T}$, current switch N2 turns on; when $V_{GSN2}<V_{GSN2T}$, it turns off, so that all tail currents can flow into or much more currents can flow out from load capacitors of the pre-amplifier.

4. The pre-amplifier set forth in claim 1, wherein if D1 and D2 represent two diodes, $V_{D1}$ and $V_{D2}$ represents the voltage difference between two terminals of D1 or D2 with rated currents passing through them, and $V_{OUTP\_mim}$, $V_{OUTN\_mim}$ represents the minimum voltage of positive and negative output terminals of the pre-amplifier respectively, the equation for minimum voltage is as follows:

$$V_{OUTN\_mim}=V_{INN}+V_{DSN2}+V_{D1}$$

$$V_{OUTP\_mim}=V_{INP}+V_{DSN1}+V_{D2}.$$

5. A pre-amplifier, comprising:
at least two PMOS transistors as source followers and two NMOS transistors as amplifiers, or at least two NMOS transistors as source followers and two PMOS transistors as amplifiers for increasing or decreasing voltage;
at least four tail current sources with same current value, wherein a charging and discharging current of a load capacitor of two output terminals Out_p and Out_n are adjusted according to a differential voltage of two input terminals $V_{INN}$ and $V_{INP}$;
two diodes; and
a receiver, wherein if two NMOS transistors are used as source followers to implement source following of and lower the voltage on the input signals and two PMOS transistors are used as current switches to turn on and control the gate-source voltage of the two PMOS transistors, wherein the two diodes are used to attain the maximum clamping voltage; the receiver is used to process the preamplified signals with its input terminals as the equivalents of two equal load capacitors of the preamplifier.

6. The pre-amplifier set forth in claim 5, if P1, P2, N1, N2, D1, D2, RECEIVER are used to represent two PMOS transistors, two NMOS transistors, two diodes and a receiver respectively; ib1, ib2, ib3 and ib4 represent four current sources; $V_{INN}$ and $V_{INP}$ represents two input signals; Voutp and Voutn represent two input terminals of the receiver; vdd represents the power, their connections are as follows:
the drains of N1 and N2 are grounded;
the gate of N1 is connected with VINN and the gate of N2 is connected with $V_{INP}$;
the source of N1 is connected with the gate of P1 and also connected with ib2;
the source of N2 is connected with the gate of P2 and also connected with ib1;
the source of P1 is connected with $V_{INP}$, the substrate of P1 is connected to vdd and the drain of P1 is connected with the positive electrode of D1;
the source of P2 is connected with $V_{INN}$, the substrate of P2 is connected to vdd and the drain of P2 is connected with the positive electrode of D2;
the positive electrode of D1 is connected with the drain of P1; the negative electrode of D1 is connected with ib3 and also connected to Voutp;
the positive electrode of D2 is connected with the drain of P2; the negative electrode of D2 is connected with ib4 and also connected to Voutn.

7. The pre-amplifier set forth in claim 5, wherein if P1 and P2 represent two PMOS transistors, and $V_{GSP1T}$ and $V_{GSP2T}$ represent their gate-source voltage respectively when rated currents are following through, the switching characteristics of the PMOS transistors, operating as amplifiers, are as follows:
when $|V_{GSP1}|>|V_{GSP1T}|$, current switch P1 turns on; when $|V_{GSP1}|<|V_{GSP1T}|$, P1 turns off, so that greater electric charges go to load capacitors or be drawn out from load capacitors by virtue of rated tail currents;
when $|V_{GSP2}|>|V_{GSP2T}|$, current switch P2 turns on; when $|V_{GSP2}|<|V_{GSP2T}|$, P2 turns off, so that greater electric charges go to load capacitors or drawn out from load capacitors by virtue of the rated tail currents.

8. The pre-amplifier set forth in claim 5, wherein if D1 and D2 represent two diodes, $V_{D1}$ and $V_{D2}$ represents the voltage difference between two terminals of D1 or D2 with rated currents passing through them, and $V_{OUTP\_max}$ and $V_{OUTN\_max}$ represent maximum voltages which the positive and negative output terminal of the preamplifier outputs respectively, the equation for maximum voltage is as follows:

$$V_{OUTN\_max}=V_{INN}-V_{DSN2}-V_{D2}$$

$$V_{OUTP\_max}=V_{INP}-V_{DSN1}-V_{D1}.$$

* * * * *